(12) United States Patent
Meyer et al.

(10) Patent No.: US 9,312,198 B2
(45) Date of Patent: Apr. 12, 2016

(54) CHIP PACKAGE-IN-PACKAGE AND METHOD THEREOF

(71) Applicant: Intel Mobile Communications GmbH, Neubiberg (DE)

(72) Inventors: Thorsten Meyer, Regensburg (DE); Sven Albers, Regensburg (DE); Andreas Wolter, Regensburg (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 0 days.

(21) Appl. No.: 13/833,514

(22) Filed: Mar. 15, 2013

(65) Prior Publication Data

US 2014/0264914 A1    Sep. 18, 2014

(51) Int. Cl.
| | |
|---|---|
| H01L 23/48 | (2006.01) |
| H01L 23/52 | (2006.01) |
| H01L 29/40 | (2006.01) |
| H01L 23/31 | (2006.01) |
| H01L 25/065 | (2006.01) |
| H01L 25/03 | (2006.01) |
| H01L 25/00 | (2006.01) |
| H01L 21/66 | (2006.01) |
| H01L 25/10 | (2006.01) |

(52) U.S. Cl.
CPC ............... *H01L 23/31* (2013.01); *H01L 25/03* (2013.01); *H01L 25/0657* (2013.01); *H01L 25/50* (2013.01); *H01L 22/14* (2013.01); *H01L 25/105* (2013.01); *H01L 2224/18* (2013.01); *H01L 2225/06517* (2013.01); *H01L 2225/06524* (2013.01); *H01L 2225/06548* (2013.01); *H01L 2225/06572* (2013.01); *H01L 2924/1461* (2013.01)

(58) Field of Classification Search
USPC .......................................... 257/774, 776, 777
See application file for complete search history.

(56) References Cited

U.S. PATENT DOCUMENTS

| | | | |
|---|---|---|---|
| 2004/0063304 A1* | 4/2004 | Hagen et al. ................... | 438/613 |
| 2007/0096334 A1* | 5/2007 | Kawabata et al. ............. | 257/777 |
| 2007/0181989 A1* | 8/2007 | Corisis et al. ................. | 257/686 |
| 2007/0216010 A1 | 9/2007 | Yim et al. | |
| 2009/0041977 A1* | 2/2009 | Fjelstad ........................ | 428/131 |
| 2009/0298227 A1* | 12/2009 | Yang ............................. | 438/108 |
| 2010/0117242 A1* | 5/2010 | Miller ................. | H01L 23/3107 257/777 |
| 2010/0187681 A1* | 7/2010 | Chen et al. .................... | 257/712 |

FOREIGN PATENT DOCUMENTS

| | | |
|---|---|---|
| KR | 2007009449 | 9/2007 |
| KR | 20090028502 | 3/2009 |
| WO | 2008143675 A1 | 11/2008 |

OTHER PUBLICATIONS

Office Action received for the corresponding South Korean Patent Application No. KR 2014-0029936, received on May 6, 2015, 17 pages incl. English translation.

* cited by examiner

*Primary Examiner* — Marc Armand
*Assistant Examiner* — Wilner Jean Baptiste
(74) *Attorney, Agent, or Firm* — Viering, Jentschura & Partner MBB

(57) ABSTRACT

An electronic package includes an interposer, a die attached to a first side of the interposer, an embedded electronic package attached to a second side of the interposer, an encapsulation compound, a set of vias providing electrical paths from a first side of the electronic package to the interposer through the encapsulation compound, and a redistribution layer electrically redistributing the set of vias to form a set of interconnect-pads. Either the die or the embedded electronic package, or both, are electrically connected to the interposer.

11 Claims, 10 Drawing Sheets

Step 10)

Step 1)

Step 2)

Step 3)

Step 4)

Step 5)

Step 6)

Step 7)

Step 8)

Step 9)

Step 10)

Step 1)

Step 2)

Step 3)

Step 4)

Step 5)

Step 6)

Step 7)

Step 8)

Step 9)

Step 10)

Step 11)

CHIP PACKAGE-IN-PACKAGE AND METHOD THEREOF

FIELD OF THE DISCLOSURE

This disclosure relates to devices and methods of manufacturing electronics, and more particularly, to packages and manufacturing methods thereof.

BACKGROUND

In manufacturing integrated circuits (ICs), the ICs, called chips or dies, are generally packaged prior to distribution and integration with other electronic assemblies. This packaging usually includes encapsulating the chips in a material and providing electrical contacts on the exterior of the package to provide an interface to the chip. Chip packaging may provide electrical connection from chip to a motherboard of an electrical or electronic product, protection from contaminants, provide mechanical support, disperse heat, and reduce thermo-mechanical stresses.

Because of the relation between IC fabrication and IC packaging, IC packaging also must generally progress with the rapid advancements in the semiconductor industry. In particular, there is an ongoing to desire to package ICs and other electronics to make them smaller, faster, and more reliable.

SUMMARY

In a first aspect of this disclosure, a chip package includes a first substrate, a first chip arranged over the first substrate, a second substrate arranged over the chip on a side opposite the first substrate, the second substrate including at least one contact and at least one electrically conductive line coupled to the contact; and encapsulation material at least partially encapsulating the second substrate and the first chip; at least one contact hole extending through the encapsulation material to electrically couple the at least one contact of the second substrate.

In another aspect of this disclosure, a method for manufacturing a chip package includes providing a carrier, placing a first chip on the carrier, adhering the first chip and an interposer together, the interposer having a second chip coupled thereto, forming an encapsulation compound around the first chip and the second chip, drilling at least one via from a first side of the encapsulation compound to the interposer through the encapsulation compound, filling the at least one via with an electrically conductive material, and applying a redistribution layer electrically redistributing the at least one via to form a set of interconnect-pads.

In a further aspect of this disclosure, a method for manufacturing a compound package includes providing a carrier, placing a chip package on the carrier, the chip package including a second chip connected to an interposer or lead frame, adhering a first chip to said interposer or lead frame, forming an encapsulation compound around the first chip and the chip package, drilling at least one via from a first side of the encapsulation compound to the interposer through the encapsulation compound, filling the at least one via with an electrically conductive material, applying a redistribution layer electrically redistributing said at least one via to form at least one interconnect pad.

BRIEF DESCRIPTION OF THE DRAWINGS

To further clarify the above and other advantages and features of the present disclosure, a more particular description of the aspects of the present disclosure will be rendered by reference to specific aspects thereof that are illustrated in the appended drawings. It is appreciated that these drawings depict only typical aspects of the present disclosure and are therefore not to be considered limiting of its scope. The present disclosure will be described and explained with additional specificity and detail through the use of the accompanying drawings in which.

DETAILED DESCRIPTION

Reference will now be made to figures wherein like structures will be provided with like reference designations. It is understood that the drawings are diagrammatic and schematic representations of exemplary aspects of the present disclosure, and are not limiting of the present disclosure nor are they necessarily drawn to scale.

The following detailed description refers to the accompanying drawings that show, by way of illustration, specific details in which aspects of the present disclosure may be practiced.

The word "exemplary" is used herein to mean "serving as an example, instance, or illustration". Any aspect or design described herein as "exemplary" is not necessarily to be construed as preferred or advantageous over other aspects.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The word "chip" or "electronic chip" is intended to encompass any device that manufactured using semiconductor device fabrication technologies, including integrated circuits, MEMS, NEMS, typically formed on wafers, such as silicon, and separated into individual die, the individual die also referred to herein as a "chip." Chips are typically provided with one or more electrical contact or interconnect which provide electrical connection to relevant circuitry on a chip.

Chips (alternatively referred to herein as dies) are generally packaged prior to distribution and integration with other electronic assemblies. This packaging usually includes encapsulating the chips in a material and providing electrical contacts on the exterior of the package to provide an interface to the motherboard of an electrical or electronic product. Chip packaging, amongst other things, may provide electrical connection from chip to a motherboard of an electrical or electronic product, protection from contaminants, provide mechanical support, disperse heat, and reduce thermo-mechanical stresses.

Stacking multiple chips within a single package is an increasingly common packaging requirement in order to reduce, for example, overall assembly size, functional circuit speed, and overall costs. One means of stacking multiple chips within a single package includes embedding existing chip packages, together with one or more additional existing packages or chips, into a single package.

Figure 1:
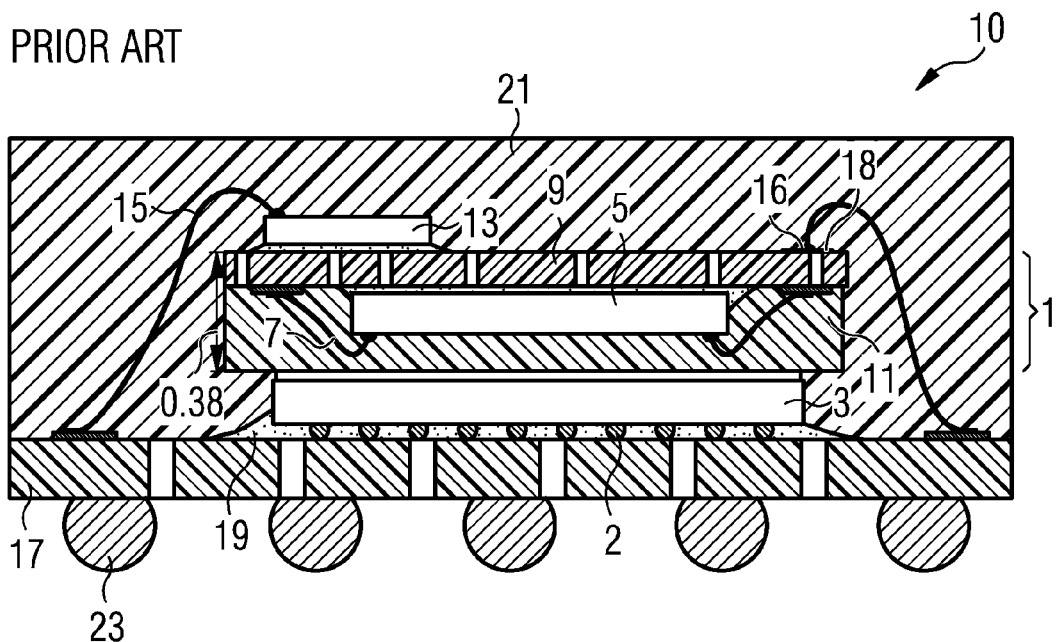
FIG. 1 is a wire-bond package-in-package.

FIG. 1 is a wire-bond package-in-package 10. Wire-bond package-in-package 10 combines an embedded wire-bond package 1 with a die 3 in a single package. More particularly, embedded wire-bond package 1 packages die 5 using wire-bond technology wherein die 5 is provided with wire-bonds 7 electrically connecting die 5 to substrate 9. Die 5 and wire-bonds 7 are encapsulated by encapsulation compound 11 to form embedded wire-bond package 1.

Embedded wire-bond package 1 is provided with contact pads, such as contact pad 16 on substrate 9. Contact pad 16 may be electrically coupled, such as to substrate 17 by bond wire 18. A die or passive device (e.g. integrated passive device) 13 may also be provided on substrate 9, attached thereto such as by an adhesive. Wire-bond 15 is shown providing an electrical connection between die 13 and substrate 17. These structures are 'external' to embedded wire-bond package 1 insofar as their structure is located outside of encapsulation 11, and serve to connect embedded wire-bond package 1 to the surrounding structures of wire-bond package-in-package 10 into which it is integrated.

More particularly, embedded wire-bond package 1 is shown with its encapsulation 11 adhered to die 3. Die 3 is arranged in a 'flip-chip' interconnect configuration. More specifically, contacts on one side of die 3 may be provided with solder bumps establishing an electrical connection between die 3 and substrate 17. Underfill layer 19 is provided between die 3 and substrate 17. In this manner, each of dies 5, 13 and 3 may be electrically coupled to substrate 17. The components disposed on the top side of substrate 17 are all encased in encapsulation compound 21, forming package 10, bounded on its bottom side by substrate 17. Solder balls 23 are provided on the bottom side of substrate 17.

In operation, substrate 17 provides electrically conductive paths from connections on one side thereof to the other, more particularly, from a top side covered by encapsulation to an exposed bottom side. A unitary package is thereby formed with the aforementioned components. Solder balls 23 on substrate 17 provide a solderable electrical interface to the encapsulated chips.

While wire-bond package-in-package 10 provides an embedded structure of packages inside packages, there is a desire for improved electronic packaging due to package sizes and electrical performance, which can be achieved by wire bond packages.

Figure 2:
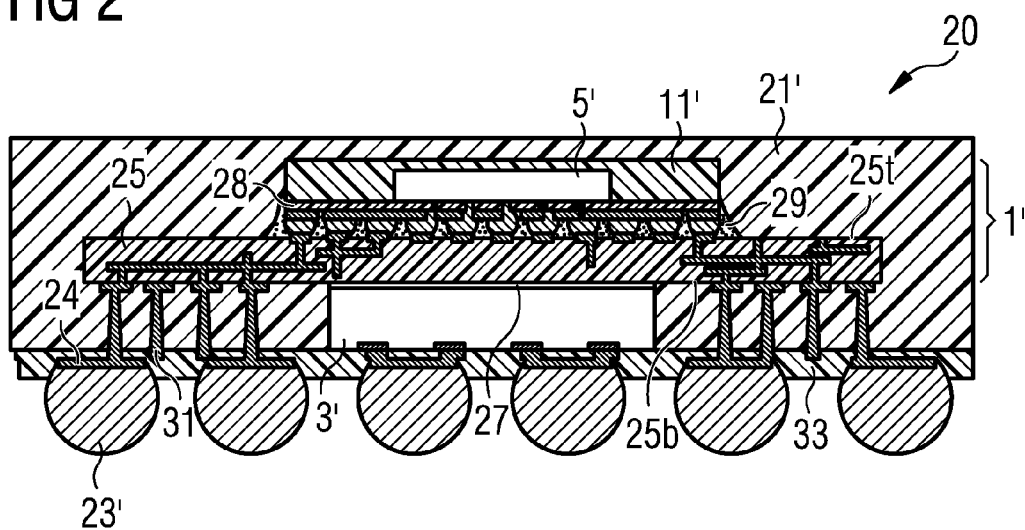
FIG. 2 is an exemplary package-in-package.

FIG. 2 is an electronic package-in-package 20 according to an aspect of the disclosure. Package 20, which may be an electronic package, includes embedded electronic ball grid array (BGA) package 1' which itself is shown including die 5' which is shown in a flip-chip configuration. Alternatively, a wirebond BGA or a QFN (quad flat no leads) package may also be used. The flip chip BGA is shown including interposer substrate 25. More particularly, a redistribution layer or interconnect layer 28 is provided having electrical connections to die 5' on a first side, and providing a plurality of contacts, typically across a larger surface area on a second side. Contacts on the second side of layer 28 are shown provided with solder bumps 29 establishing an electrical connection between interposer 25 and die 5'. As shown, BGA 1' is a complete package including interposer 25 solder bumps 29 and die 5' embedded within mold or encapsulation compound 11'. Moreover, interposer/substrate 25 is shown having a lateral dimension overhanging or extending beyond the lateral dimension of chip 3.

BGA package 1' is shown attached to die 3' by adhesive 27, which may be in the form of tape or glue, such as die attach film (DAF) or epoxy adhesive. In combination, BGA package 1' and die 3', which may also be a flip-chip, forms a stack which may be over-molded with a mold compound 21', or can be laminated. The format of the over-molding may be any shape, such as round, rectangular or square.

As shown, embedded package, or BGA package, 1' provides electrical connections on second side 25b of interposer 25, whereas electrical connections on die 3' face away from interposer 25, and, facing in the same direction as second side 25b of interposer 25 may be connected directly to redistribution layer 33. Alternatively, die 3' may be electrically connected to interposer 25 and therethrough to BGA package 1', interposer 25 providing contacts for both die 5' and die 3', for example on its second side. As another alternative, multiple dies and/or embedded packages may be included and variously connected to interposer 25 or directly to redistribution layer 33.

Embedded package 1', as shown, has die 5' embedded therein. It is envisioned, however, that both embedded package 1' and package 20, may have multiple dies and/or embedded packages embedded therein. In some applications, it may be useful to have embedded package 1' simply be a substrate or other various passive and active components. It may be desirable to test and burn embedded package 1' before assembling package 20.

Encapsulation compound 11' is shown surrounding die 5', forming a unitary package, referred to herein, in combination with interposer 25 as embedded package 1'. The dimensions of package 1' are defined at least in part by the extent of encapsulation compound 11', which is shown extending to the edges of interconnect layer 28. As noted below, the area provided for contact pads on layer 28 may be defined by the dimensions of encapsulation 11' providing structural support for layer 28. Alternatively, embedded package 1' may be a standard flip chip configuration, wherein die 5' is attached by underfill.

Encapsulation compound 21' surrounds die 3', interposer 25, and embedded Package 1'(an embedded package or an embedded package which is itself a standard flip chip, which has been embedded), and in this way forms a unitary package illustrated as package 20. A plurality of vias 31 (alternatively referred to herein as contact holes) are shown extending through encapsulation compound 21' from contacts on the second side 25b of interposer 25 to redistribution layer 33. Electrical contact between second side 25b of interposer 25 is thus established to redistribution layer 33, in which conductors route respective electrical connections between vias 31 on one side of the redistribution layer and interconnect pads 24 to which solder balls 23 are shown attached. The vias can conveniently be positioned between the lateral dimension of interposer 25 overhanging or extending beyond the lateral dimension of chip 3 and redistribution layer 33.

Dies 3' and 5' may be fabricated according to standard semiconductor manufacturing processes. That is, generally after an ingot is grown it is sliced into wafers. Areas of the wafer may undergo deposition, removal, patterning, and doping processes. Once the wafer has been processed, the wafer is generally mounted and diced into individual dies. Die 5', in particular, is further packaged and provided as part of embedded package 1'.

Encapsulation compounds 11' and 21' are generally composed of a plastic material, and may be filled with silica, metal or ceramic filler or any other filler material. Interposer substrate 25 may be a printed circuit board, or alternately a ceramic or metal, such as lead frame. Thermosetting encapsulation compounds, in particular, are a type of plastic material based on epoxy resins. These types of compounds have historically been used in electronic packaging applications. Thermoplastics or laminates and prepregs [tm1]are another type of plastic material which may be used as an encapsulation compound. Pre-preg is a term for "pre-impregnated" composite fibres where a material, such as epoxy is already present. These usually take the form of a weave or are unidirectional. They already contain an amount of the matrix material used to bond them together and to other components during manufacture. The resin is only partially cured to allow easy handling, this is call B-Stage material and requires cold storage to prevent complete curing. B-Stage pre-preg is always stored in cooled areas since complete polymerization is most commonly done by heat. Hence, composite structures built of prepregs will mostly require an oven or autoclave to finish the complete polymerization.

Vias 31 may be formed by drilling holes through encapsulation compound 21' and then filling the drilled holes with an electrically conductive material. The drilling of via holes may be performed, for example, with a mechanical drill, a laser, or through chemical etching. If a laser is used, the copper pads of the interposer substrate 25 may be used as stop for the laser drilling.

Package 1' may be manufactured and supplied separately from the other components in package 20. As noted above, package 1' may be a flip-chip electronic package, a wire-bond electronic package, or an embedded wafer-level ball grid array (eWLB) electronic package. Preferably, such as when embedded in combination with other components such as those shown in package 20, either a flip-chip package or an embedded flip chip package is used for package 1' in order, for example to minimize package dimensions. An embedded flip chip package, for example, would be understood to contain a die and a molding compound surrounding the die. The die pads, on the active chip side, would be rerouted by means of at least one redistribution or interconnect layer on the die and the surrounding mold compound area being substantially coplanar with the active chip surface. Flip chip bumps are applied at the end of the redistribution layers and a flip chip interconnect by soldering and later underfilling is generated. The surrounding mold compound around the chip allows more flip chip bumps in a given pitch or a greater bump pitch as it would be possible with the die alone.

Figure 3:
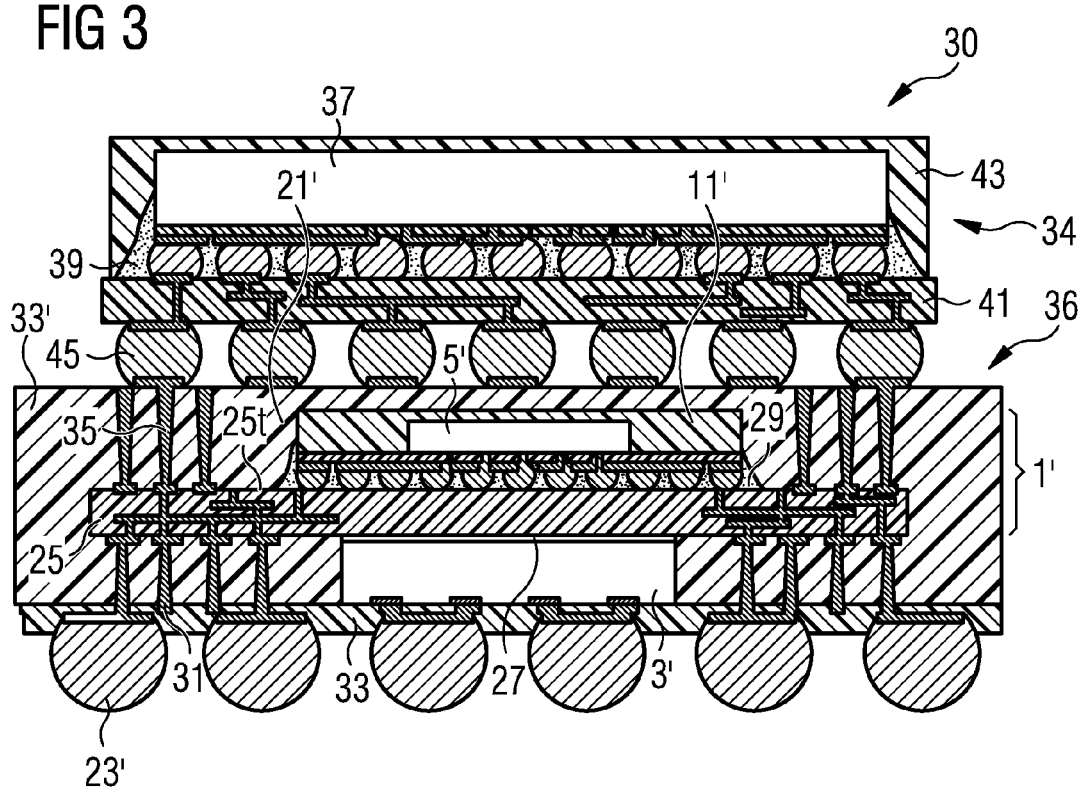
FIG. 3 is an exemplary package-in-package having a top mounted package.

FIG. 3 is an exemplary compound package 30 integrating a package-in-package 36 having a top package 34 mounted thereon. Package 36 is shown having a similar basic structure to that of package 20 described in reference to FIG. 2. In addition to the features shown and described with reference to FIG. 2, vias 35 are provided from top surface 25t of interposer 25 to a redistribution layer 33' located on a surface (e.g. a top surface) of package 36 opposite to that of redistribution layer 33 (e.g. provided, as shown in FIG. 2, on a bottom layer thereof). As described with reference to vias 31, vias 35 provide electrical contact between interposer 25 and respective redistribution layer 33' through encapsulation compound 21'.

A second package 34 is shown having a configuration similar to that of package 1' described in reference to FIG. 2. In particular, die 37 is shown electrically connected via solder bumps and underfill 39 to an interposer/substrate 41 similar to interposer 25. However, substrate 41 is adapted to be provided with conductive interconnect elements 45 which establish a physical and electrical connection between packages 34 and 36. Accordingly, package 34 is rendered physically secure to package 36, whereby individual interconnect elements establish discreet electrical connections between packages 34 and 36. Conductive elements 45 can be solder balls, solder interconnects such as a land grid array, a conductive glue or similar. Package 34 may be encapsulated within encapsulation compound 43.

Similar to vias 31, described with reference to FIG. 2, vias 35 may be formed by drilling holes through encapsulation compound 21' which drilling may be performed, for example, with a mechanical drill, a laser, or through chemical etching.

Package 34 may be manufactured and supplied separately from package 36, or may be implemented with various packaging techniques, including flip-chip and wire-bonding. Additionally, package 34 may contain multiple dies, or may have one or more packages embedded therein. Moreover, package 34 may include various functions such as a memory module and/or a sensor.

Figure 4:
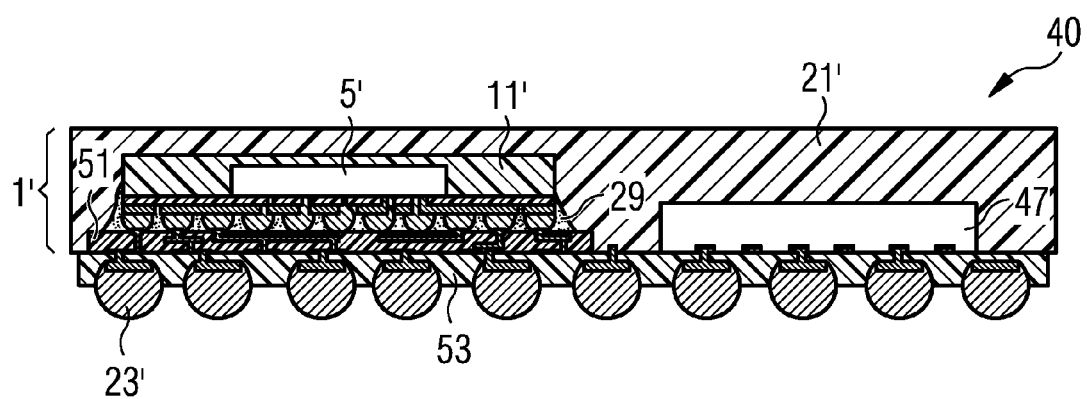
FIG. 4 is an exemplary package-in-package having a lateral stacking configuration.

FIG. 4 is an exemplary package-in-package 40 having a lateral stacking configuration. As can be seen, embedded package 1' is placed laterally proximal to die 47, shown in this aspect on a single redistribution layer 53. Package 40 includes at least one redistribution or rerouting layer 53 having a set of interconnect-pads on the bottom side. Interposer 51 can be coupled to the interior side of redistribution layer 53 along with die 47 or at least partly be directly connected with solder balls 23 via a part of the redistribution layer 53. Embedded package 1' is coupled to the top side of interposer 51, and encapsulation compound 21' encapsulates die 47, interposer 51, and embedded package 1'.

The configuration of package 40 may be used where high density routing and low density routing is desired in a single package. In this way, the number of redistribution layers at on the left side of the figure where interposer 51 adds rerouting layers will be higher than on the right hand side of the FIG. 4, where only routing layer 53 appears. In FIG. 4, for example, high density routing may take place on the left side of the figure where interposer 51 adds a certain level of higher density routing, in addition to redistribution layer 53 located below interposer 51. On the right side of the figure, where there is no interposer, redistribution layer 53 may used for lower density routing.

Figure 5:
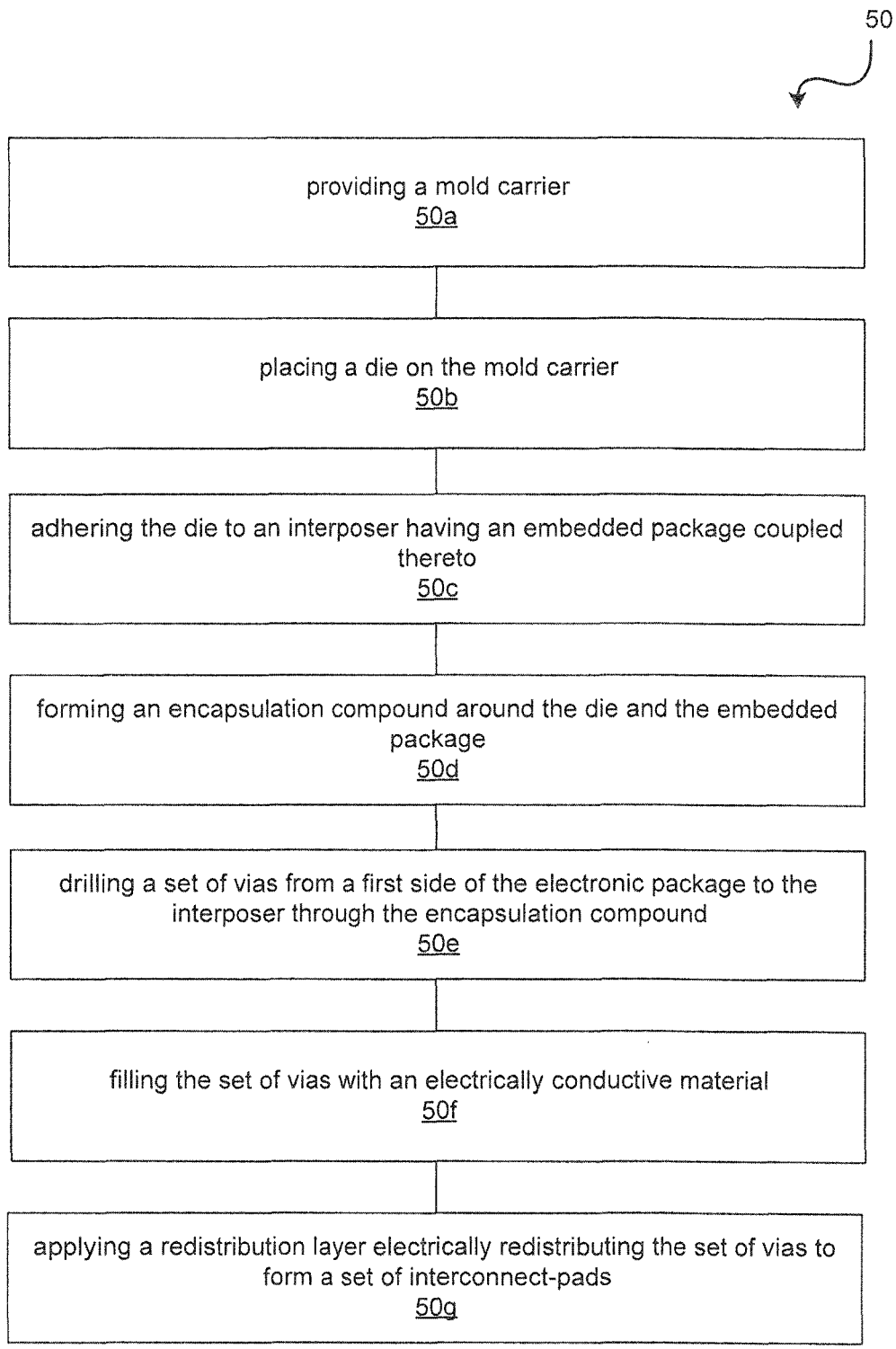
FIG. 5 illustrates an exemplary method for manufacturing a package-in-package.

FIG. 5 illustrates an exemplary method 50 for manufacturing a package-in-package. Method 50 includes providing 50A a mold carrier, placing 50B a die on the mold carrier, adhering 50C the die to an interposer having an package coupled thereto, forming 50D an encapsulation compound around the die and the package, drilling 50E a set of vias from a first side of the package to the interposer through the encapsulation compound, filling 50F the set of vias with an electrically conductive material, and applying 50G a redistribution layer electrically redistributing the set of vias to form a set of interconnect-pads.

A die attach film (DAF) or an adhesive foam may be used, for example, as the adhesive, and may be applied through placing, laminating, printing, or dispensing the adhesive onto either the die, the interposer, or both the die and the interposer.

The interposer is an electrical interface providing routing between one surface and another surface, and reroutes or spreads interfaced electrical device, such as a the embedded package, to a wider pitch.

Embedded package may have various components embedded therein such as one or more dies and/or one or more embedded packages. In some applications, it may be useful to have the embedded package simply be a substrate or other various passive and active components.

Drilling 50E may be performed, for example, with a mechanical drill, a laser, or through chemical etching, and filling 50F may be performed, for instance, with electrochemical deposition, electroplating or by applying electrically conductive particles disposed therein, e.g. by printing. Additionally, applying 50G redistribution layer may be performed, for example, through thin-film technology (e.g. sputter and electroplating, electroless plating, subtractive etching or, printing.

Method 50 may further include causing the encapsulation compound to recede on a side of the package opposite where the mold carrier was provided. In this way, the thickness of package may be reduced to its minimal size. That is, the back side of the package may be reduced such that the minimal amount of encapsulation compound covers the die and/or embedded package. This may be done, for example, by grinding the back side of the package, and/or by chemical etching.

Method 50 may further include applying solder balls to the interconnect-pads. Solder balls are commonly used to interface packages with external circuitry and therefore it may be desirable to include such an interface on the package in method 50. Additionally, method 50 may further include testing and burning the embedded package prior to assembly with the die on the mold carrier. This may provide increased reliability and yield. Moreover, in testing and burning the embedded packages prior to assembly with the package, the yield may be increased. That is, faulty or unreliable embedded packages are less likely to be fully processed into the package. As a result, more finished packages work reliably, and less finished packages are discarded as a result.

Method 50 may further include drilling a second set of vias from a second side of the package to the interposer through the encapsulation compound, filling the second set of vias with an electrically conductive material, and mounting a second package onto the second set of vias on the second side of the package. In this way a package-on-package configuration similar to that described with reference to FIG. 3 may be produced.

Illustrations of a possible process flow in the manufacture of a package according to aspects of the disclosure are shown in greater detail respectively in FIGS. 6A-6J and are described in greater detail as follows. The disclosed process also illustrate aspects of the disclosed devices, in particular the exemplary aspects shown FIG. 2, above in greater structural detail.

Figure 6A:
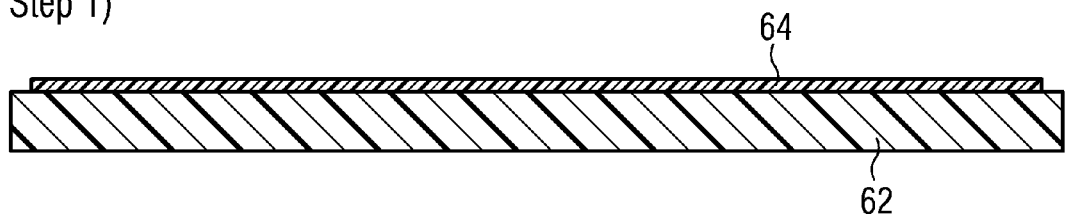
FIGS. 6A-6J illustrate an exemplary construction sequence for a package-in-package.

In Step 1 as shown in FIG. 6A, a mold carrier 62 is provided, for example, with a double-sided adhesive foil 64. These components provide a surface on which to secure elements of the package during assembly.

Figure 6B:
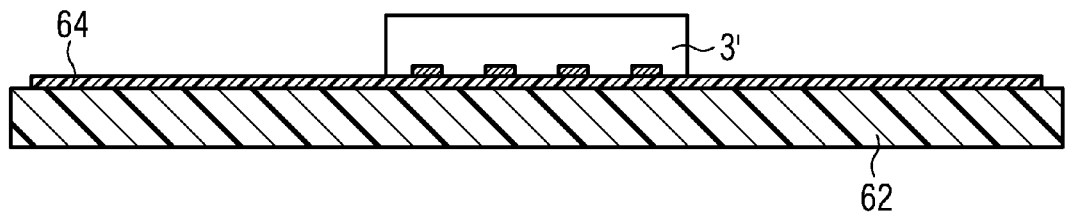

In step 2, as shown in FIG. 6B, dies such as 3' are placed face (active side) down onto adhesive tape 64. Multiple components may be placed in this manner, although only one component (die 3') is shown.

Figure 6C:
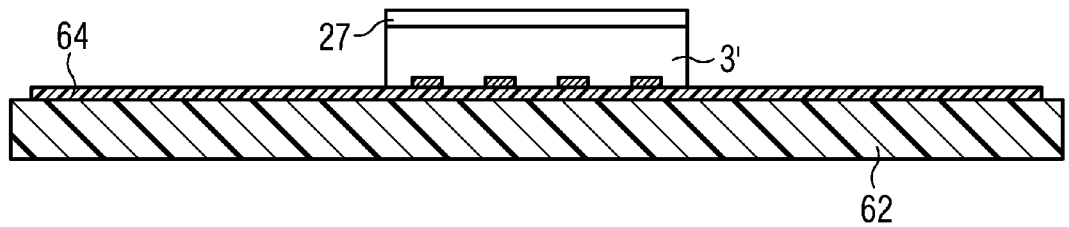

In step 3, as shown in FIG. 6C, an adhesive tape or glue, such as a DAF or epoxy adhesive 27, is applied to the backside of die 3'. Alternatively, adhesive 27 may be pre-applied to die 3' prior to step 2 of the process of FIG. 6.

Figure 6D:
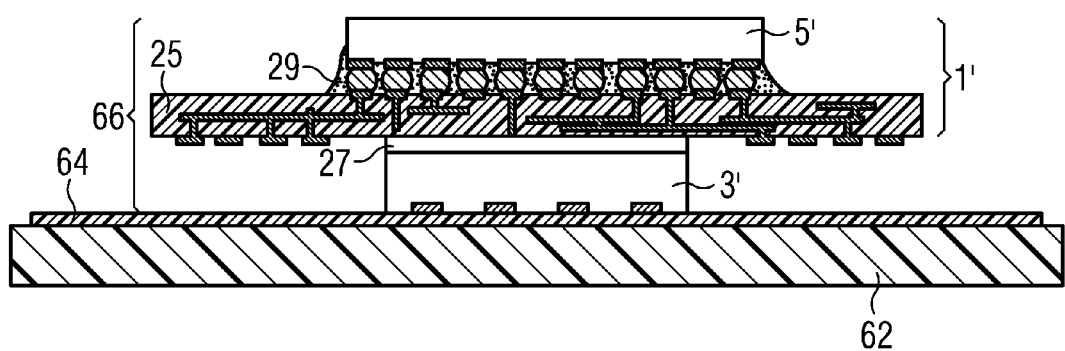

In step 4, as shown in FIG. 6D, an assembled BGA, or flip chip component or wire bond BGA (or QFN) 1' is attached to DAF 27. The resulting stack, die/flip chip stack 66 is thus assembled on mold carrier 62. BGA 1' is shown as a complete package with substrate and, for the flip chip example, solder bumps 29 and underfill. BGA 1' can be over-molded, and die 5' can be silicon or an eWLB-based embedded die (shown in greater detail in FIG. 7 below).

Figure 6E:
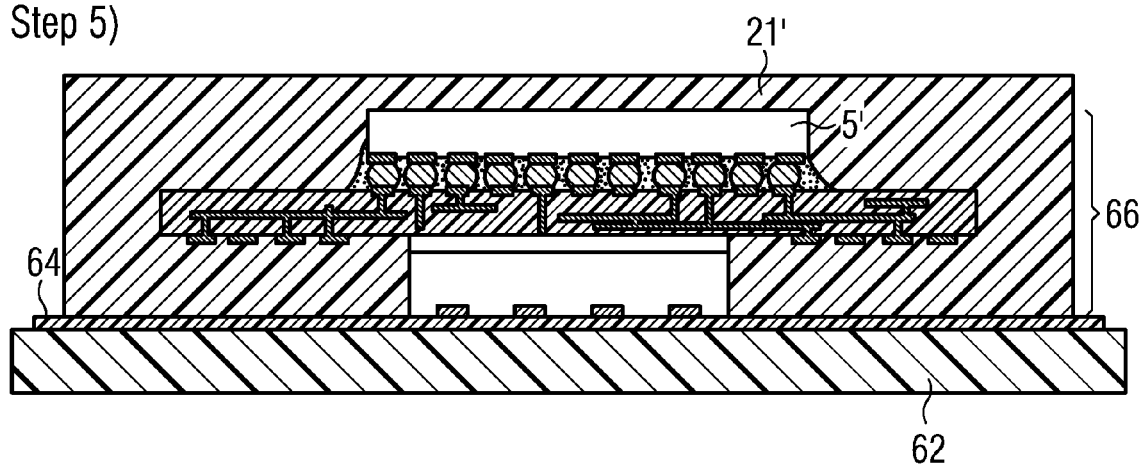

In step 5, as shown in FIG. 6E, die/flip chip stack 66 is over-molded, or alternatively laminated, with a mold compound of encapsulation material 21'. The format of the package thus assembled can be round, rectangular or square. Moreover, the encapsulation 21' may be applied with a low profile (i.e. with a minimum extension of encapsulation above die 5') or may be ground down to minimize package dimensions.

Figure 6F:
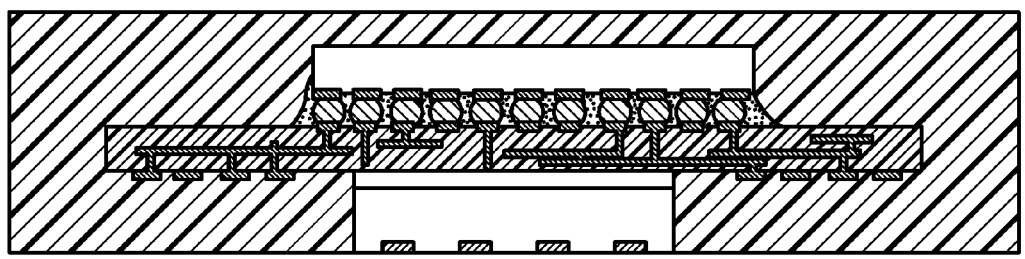

In step 6, as shown in FIG. 6F, mold carrier 62 and 64 (shown in FIGS. 6A-6E) are released from the assembly. Release is accomplished, for example, by heating adhesive foil 64 (i.e. by raising the temperature of the entire assembly) until the adhesive releases the assembly.

Figure 6G:
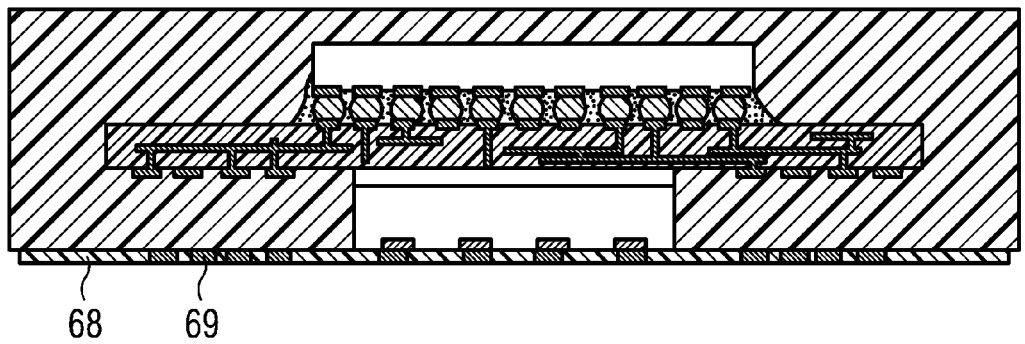

In step 7, as shown in FIG. 6G, dielectric material 68 is applied. The dielectric may be applied through spin-coating and structured in photolithography or can be laminated and laser drilled or etched to provide structured openings 69 in the dielectric layer. Dielectric layer 68 is the foundation of a first or base substrate 61 (see FIG. 6J, also identified as redistribution layer 33 in FIGS. 2 and 3, or as rerouting layer or 'carrier') on which the package may be said to be constructed. An exemplary configuration of the remaining components of substrate 61 is sequentially described below.

Figure 6H:
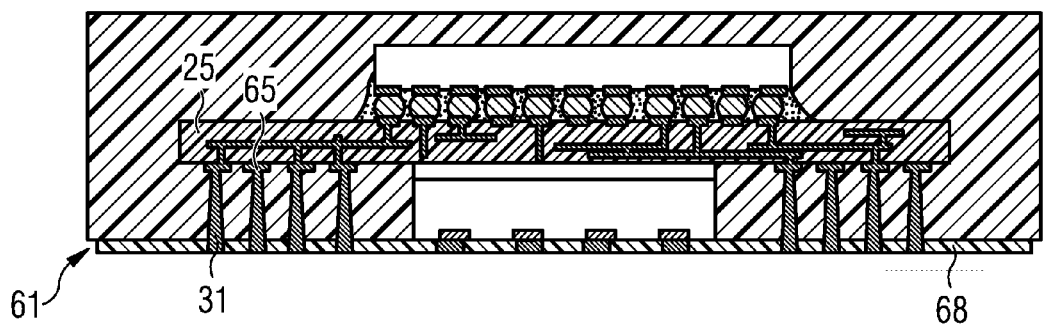

In step 8, as shown in FIG. 6H, vias 31, which may be laser or etched vias, are drilled through the mold compound. Pads 65, which may be copper, on interposer 25 may act as an etch/drill stop, setting and/or limiting via depth during drilling.

Figure 6I:
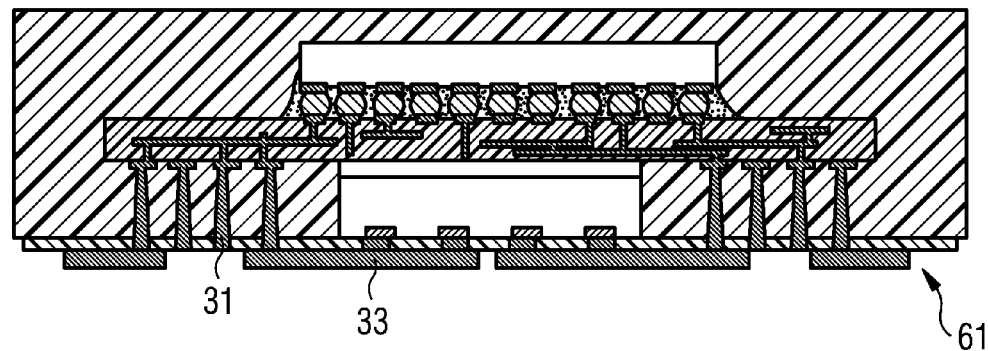

In step 9, as shown in FIG. 6I, vias 31 may be filled electrically such as by sputter and electroplating, or by electro-less plating and electroplating or printing with or without electroless- and electroplating. Vias 31 may possibly be plugged. In the same step or a later step, redistribution layer 33 is added to substrate 61 to redistribute electrical connections to vias 31.

Figure 6J:
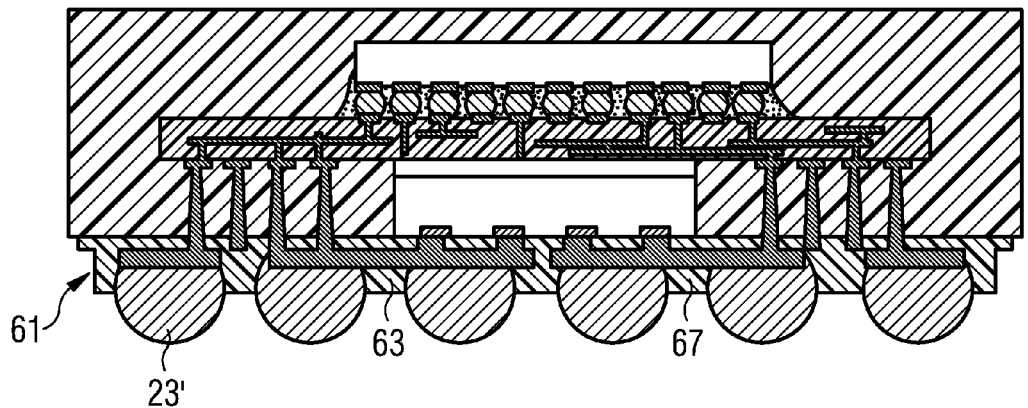

In step 10, as shown in FIG. 6J, solder stop layer 67 is shown as applied onto substrate 61, having been structured thereon. Solder balls 23' or semi balls can be applied to pad openings in the solder stop layer.

The present disclosure may be embodied in other specific forms without departing from its spirit or essential characteristics. The described aspects are to be considered in all respects only as illustrative, not restrictive. The scope of the disclosure is, therefore, indicated by the appended claims rather than by the foregoing description. All changes that come within the meaning and range of equivalency of the claims are to be embraced within their scope.

The order of the process flow shown in FIG. 6 illustrates an exemplary construction sequence for a package-in-package such as the device 20 illustrated in FIG. 2. Illustration of stepwise construction discloses aspects of the interrelationship among the package components, and is not intended to be limiting, or to specify particular combinations of components or sequences. For example, FIGS. 7A-7K illustrate an alternate process flow in the manufacture or assembly of a package such as package 20 of FIG. 2.

Figure 7A:
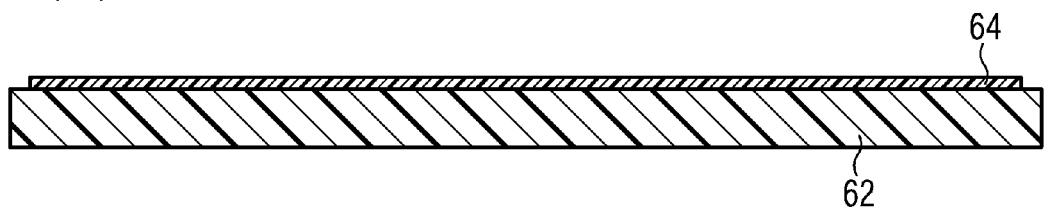
FIGS. 7A-7K illustrate an alternate process flow in the manufacture or assembly of a package.
Figure 7B:
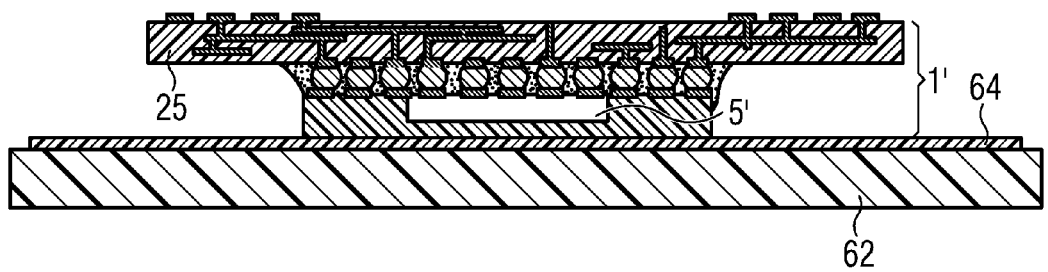

In step 1, as shown in FIG. 7A, mold carrier 62 is provided with adhesive 64 such as double sided adhesive tape or foil. In step 2, as shown in FIG. 7B, BGA package 1' is placed face down (substrate 25 side up, die 5' side down) onto adhesive tape 64. It should be noted, again, that multiple components may be placed in this manner, for example to assemble package 40 of FIG. 4, or any other combination including multiple, laterally flush components to be incorporated into a single package.

Figure 7C:
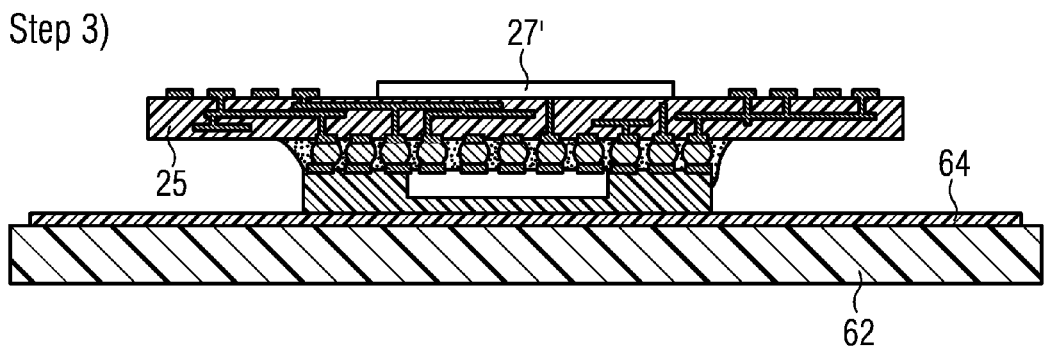
Figure 7D:
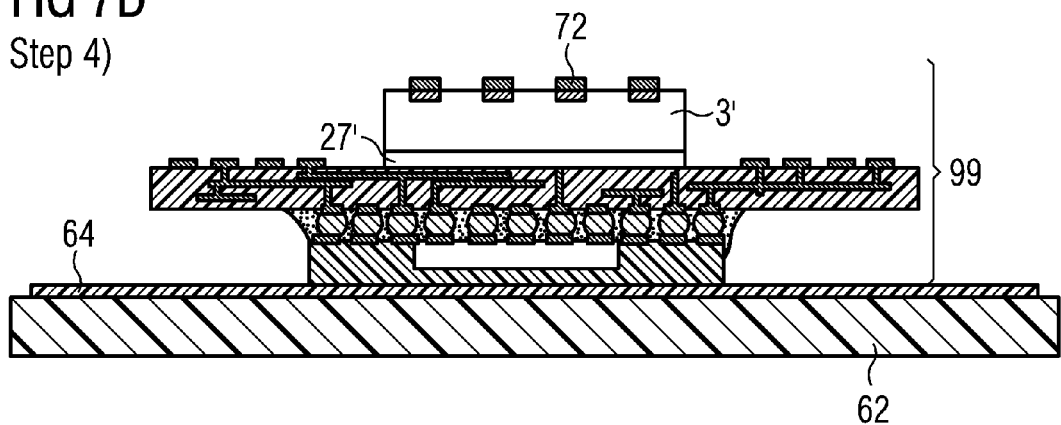

In step 3, as shown in FIG. 7C, adhesive tape or glue 27' such as a DAF or epoxy adhesive, is applied to substrate 25. Alternatively, adhesive 27' may be pre-applied to BGA 1'. In step 4, as shown in FIG. 7D, die 3' with conductively reinforced aluminum pads 72 (e.g. copper post or stud bump) is applied onto adhesive 27' forming stack 99.

Figure 7E:
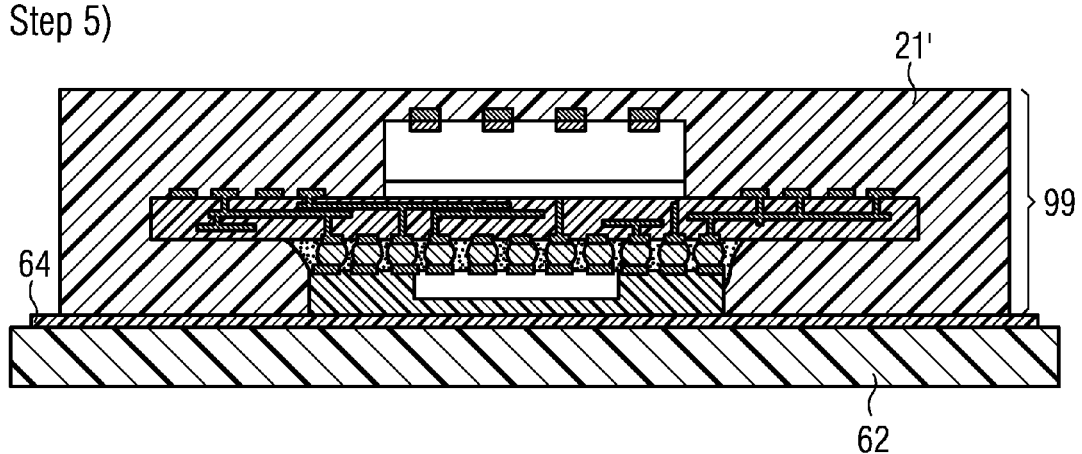
Figure 7F:
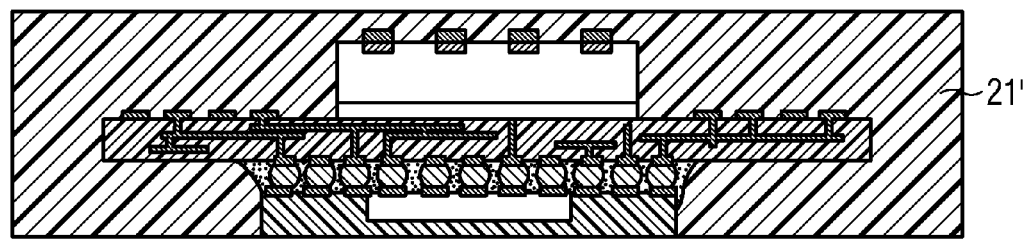

Over-molding or laminating of the of stack 99 with encapsulation material 21', followed by release (e.g. thermal release) of mold carrier 64 takes place in steps 5 and 6 as respectively shown in FIGS. 7E and 7F.

Figure 7G:
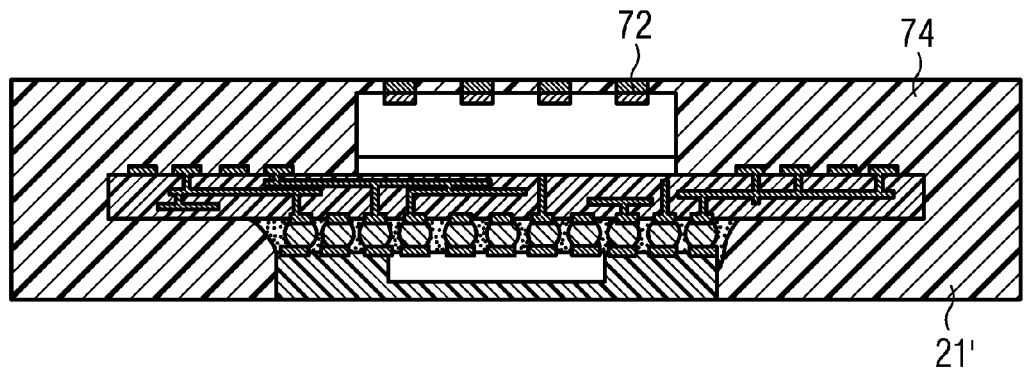

Removal, such as by grinding, of contact side 74 of encapsulation 21' may take place as illustrated in FIG. 7G until contact posts or bumps 72 are exposed, the bumps enabling the exposure of electrically conductive contacts without damage to structures on die 3'.

Figure 7H:
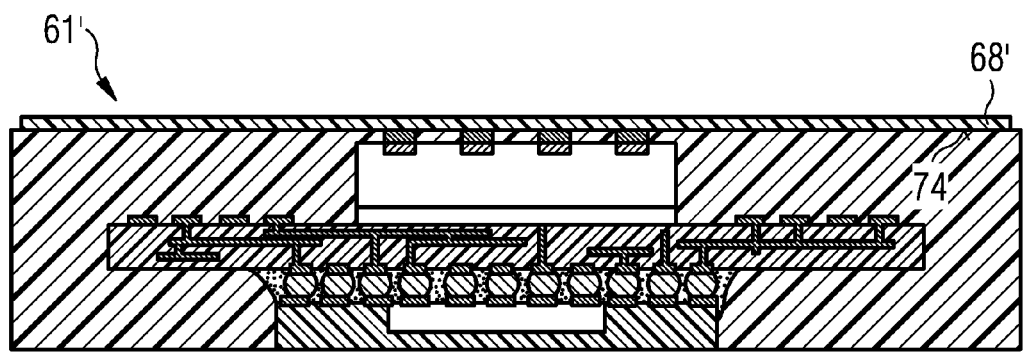
Figure 7I:
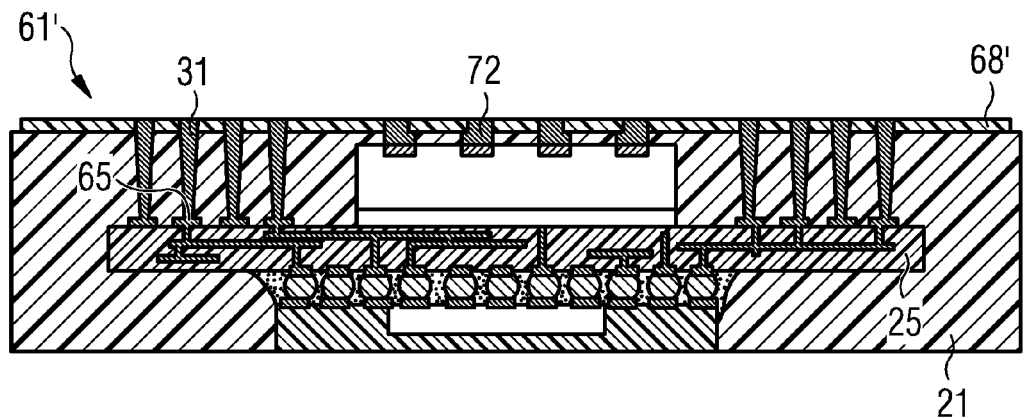

Formation of a base or first substrate 61' is begun with application of dielectric material 68' as shown in FIG. 7H over contact side 74, including potentially over exposed contact bumps 72. The dielectric may be spin-coated and/or structured in photolithography or it can be applied without structuring and may be structured together with laser drilling as shown in FIG. 7I, wherein vias 31 are provided in encapsulation 21'. In step 9, vias 31 may be drilled by laser or may be etched. Vias 31 stop at the pads of BGA substrate 25, wherein pads 65 may be made, for example, of copper and function as a drill- or etch-stop. Laser drilling may also be used, for example, to remove portions of dielectric 68' from contact bumps 72, as needed.

Figure 7J:
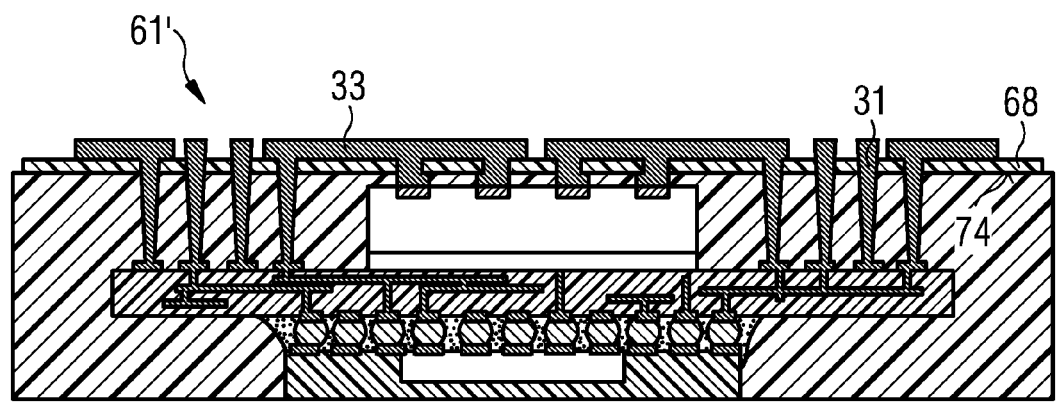
Figure 7K:
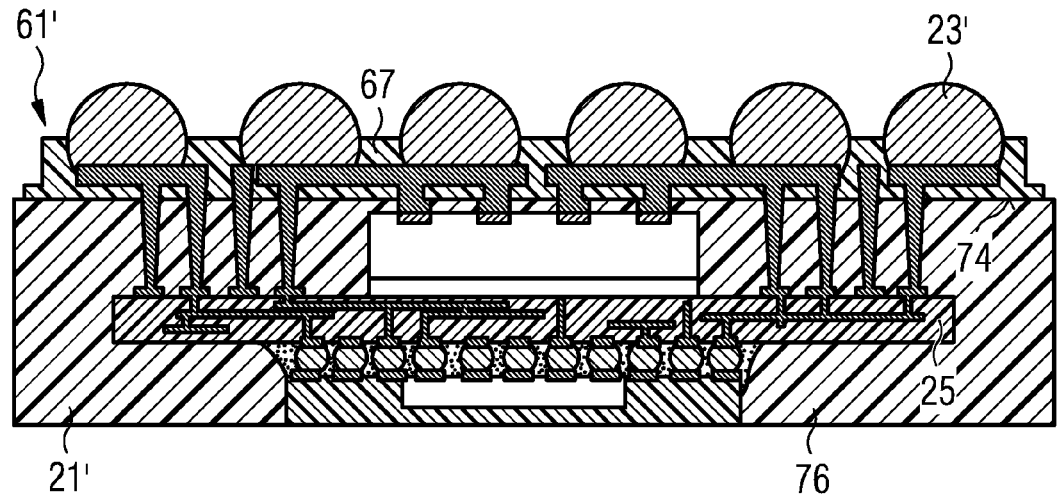

In steps 10 and 11, as shown in FIGS. 7J and 7K, vias 31 may be filled electrically and possibly plugged. Redistribution layer 33 may be applied simultaneously, or in a separate step. Solder stop layer 67 may be added to substrate 61 by application thereon, followed by solder balls 23' or semi-balls, applied to the pad openings in solder stop layer 67.

Further or alternate process steps may be advantageous, such as further laser drilling to access contact points on interposer/substrate 25, for example from side 76 of encapsulation 21'. Appropriate structuring on side 76 may be provided to allow for connection of further packages, such as the exemplary illustration of FIG. 3, in which vias 31, 35 extend in opposing directions, each from a respective side of interposer/substrate 25.

The present disclosure may be embodied in other specific forms without departing from its spirit or essential characteristics. The described aspects of the disclosure are to be considered in all respects only as illustrative, not restrictive. The scope of the present disclosure is, therefore, indicated by the appended claims rather than by the foregoing description. All changes that come within the meaning and range of equivalency of the claims are to be embraced within their scope.

What is claimed is:

1. A chip package, comprising:
   a first substrate;
   a first chip arranged over the first substrate;
   a second substrate arranged over the first chip on a top side of the first chip facing away from the first substrate, wherein the second substrate comprises one or more contacts and at least one electrically conductive line coupled to at least one of the one or more contacts, wherein the second substrate includes an overhanging lateral dimension section extending beyond a lateral dimension of the first chip; and
   a first encapsulation material at least partially embedding a second chip;
   a second encapsulation material at least partially encapsulating the first encapsulation material, the second chip, the second substrate and the first chip;
   one or more contact holes, each substantially vertically extending through the encapsulation material to electrically couple to at least one of the one or more contacts of the second substrate in the overhanging lateral dimension section of the second substrate; and
   wherein the second chip is arranged over and electrically connected to the second substrate at a non-overhanging lateral dimension so as to be in electrical connection with at least one of the one or more contact holes
   wherein a surface of the first chip facing the second chip is attached to and is electrically connected to a surface of the second substrate facing away from the second chip.

2. The chip package of claim 1, wherein the second chip is at least one of the group consisting of ball grid array, land grid array, semi-ball grid array, leadframe package QFN or QFP package type.

3. The chip package of claim 1, wherein said second substrate has an overhanging lateral dimension extending at least in part beyond a lateral dimension of said second chip.

4. The chip package of claim 3, wherein at least one additional contact hole extends from the second substrate on a side facing away from said first chip.

5. The chip package of claim 4, wherein the at least one additional contact hole extends from said at least one lateral dimension of the second substrate.

6. The chip package of claim 1, wherein the second chip and the first encapsulation material form an embedded package that is at least one of a pretested and a burned package.

7. The chip package of claim 1, wherein the second substrate is attached to the first chip via an adhesive.

8. A chip package, comprising:
   a first chip arranged over a substrate;
   an interposer arranged over the first chip;
   an embedded package arranged over the interposer, the embedded package comprising a second chip at least partially encapsulated by an encapsulation material, the second chip electrically coupled to the interposer;
   a second encapsulation material encapsulation at least partially encapsulating the embedded package, the interposer and the first chip; and
   a plurality of vias, each via extending, substantially vertically, from a side of the interposer facing toward the first chip through the second encapsulation material to a redistribution layer disposed on a bottom side of the substrate facing away from the first chip; and
   a plurality of second vias, each of the second vias extending, substantially vertically, from a side of the interposer facing toward the second chip through the second encapsulation material to a top surface of the second encapsulation material.

9. The chip package of claim 8, wherein the second chip is at least one of the group consisting of ball grid array, land grid array, semi-ball grid array, leadframe package QFN or QFP package type.

10. The chip package of claim 8, wherein said interposer has an overhanging lateral dimension extending at least in part beyond a lateral dimension of said second chip.

11. The chip package of claim 8, wherein a surface of the first chip facing toward the second chip is attached to a surface of the interposer facing away from the second chip so that the first chip is electrically connected to the interposer.

* * * * *